United States Patent [19]
Post

[11] Patent Number: 5,469,119
[45] Date of Patent: Nov. 21, 1995

[54] LINEAR VOLTAGE-CONTROLLED OSCILLATOR USING FIXED CAPACITORS IN LIEU OF VARACTORS

[75] Inventor: Irving G. Post, Lower Alsace Township, Berks County, Pa.

[73] Assignee: AT&T Corp., Murray Hill, N.J.

[21] Appl. No.: 92,141

[22] Filed: Jul. 14, 1993

[51] Int. Cl.$^6$ .................................................. H03B 5/12
[52] U.S. Cl. ................................. 331/117 R; 331/177 R
[58] Field of Search ......................... 331/116 R, 116 FE, 331/117 R, 117 FE, 177 R, 177 V

[56] References Cited

U.S. PATENT DOCUMENTS

| | | | |
|---|---|---|---|
| 3,553,380 | 1/1971 | Greenwald | 370/57 |
| 4,230,953 | 10/1980 | Wilcox | 331/116 R X |
| 4,684,904 | 8/1987 | Watkins et al. | 331/177 V X |
| 4,709,409 | 11/1987 | Ma et al. | 331/177 V X |

*Primary Examiner*—Siegfried H. Grimm

[57] ABSTRACT

The frequency of a resonant circuit in the emitter path of an output transistor is caused to vary linearly with control voltage. The control voltage is applied to a circuit that constrains the ac current through the resonant circuit to be supplied through the emitters of a two-transistor current steering circuit. The sum of the two transistor's dc emitter currents is constant while the dc current through one of the two transistors' emitters varies as the square root of the control voltage.

10 Claims, 2 Drawing Sheets

LINEAR VOLTAGE-CONTROLLED OSCILLATOR USING FIXED CAPACITORS IN LIEU OF VARACTORS

FIELD OF THE INVENTION

This invention relates to voltage controlled oscillators and, more particularly, to voltage controlled oscillators where the frequency deviation is required to be linear with respect to the control voltage.

BACKGROUND OF THE PRIOR ART

The modulation and demodulation of fm signals may employ an oscillator whose frequency varies with the modulating or control voltage. In order for the demodulated signal to faithfully reproduce the original modulation it is necessary to have the frequency vary linearly with the control voltage in both the transmitter and the receiver. Oscillators whose frequency variation is produced in accordance with a control voltage are called voltage controlled oscillators and many of these circuits employ a varactor diode as the voltage responsive variable reactance component. While the varactor diode is a popularly used element in such circuits, it is rather expensive and, in certain applications such as small, hand-held cellular telephones where only a low supply voltage is available, there may not be sufficient voltage available to permit the varactor diode to undergo a sufficient range of reactance variation to produce the desired frequency excursion of the oscillator. In addition, it is desirable to have the frequency excursion vary linearly with the control voltage. Accordingly, an alternative to the use of the varactor diode in voltage controlled oscillators circuits is desirable.

SUMMARY OF THE INVENTION

The foregoing and other objects and features of my invention are achieved in one illustrative embodiment in which the effective amount of capacitance present in the resonant circuit of a voltage-controlled oscillator is varied so that the resonant frequency varies substantially linearly with control voltage. A biasing circuit effects a current through one of a pair of paralled transistors in the feedback loop of a negative resistance oscillator that varies with the square root of the control voltage but in which the sum of the currents through the two transistors is constant. As current is divided between the two transistors in response to the control voltage, a variable fraction of the capacitance is effectively switched into and out of series with the capacitance of the resonant circuit causing its frequency to vary with the control voltage.

DETAILED DESCRIPTION

Figure 1:
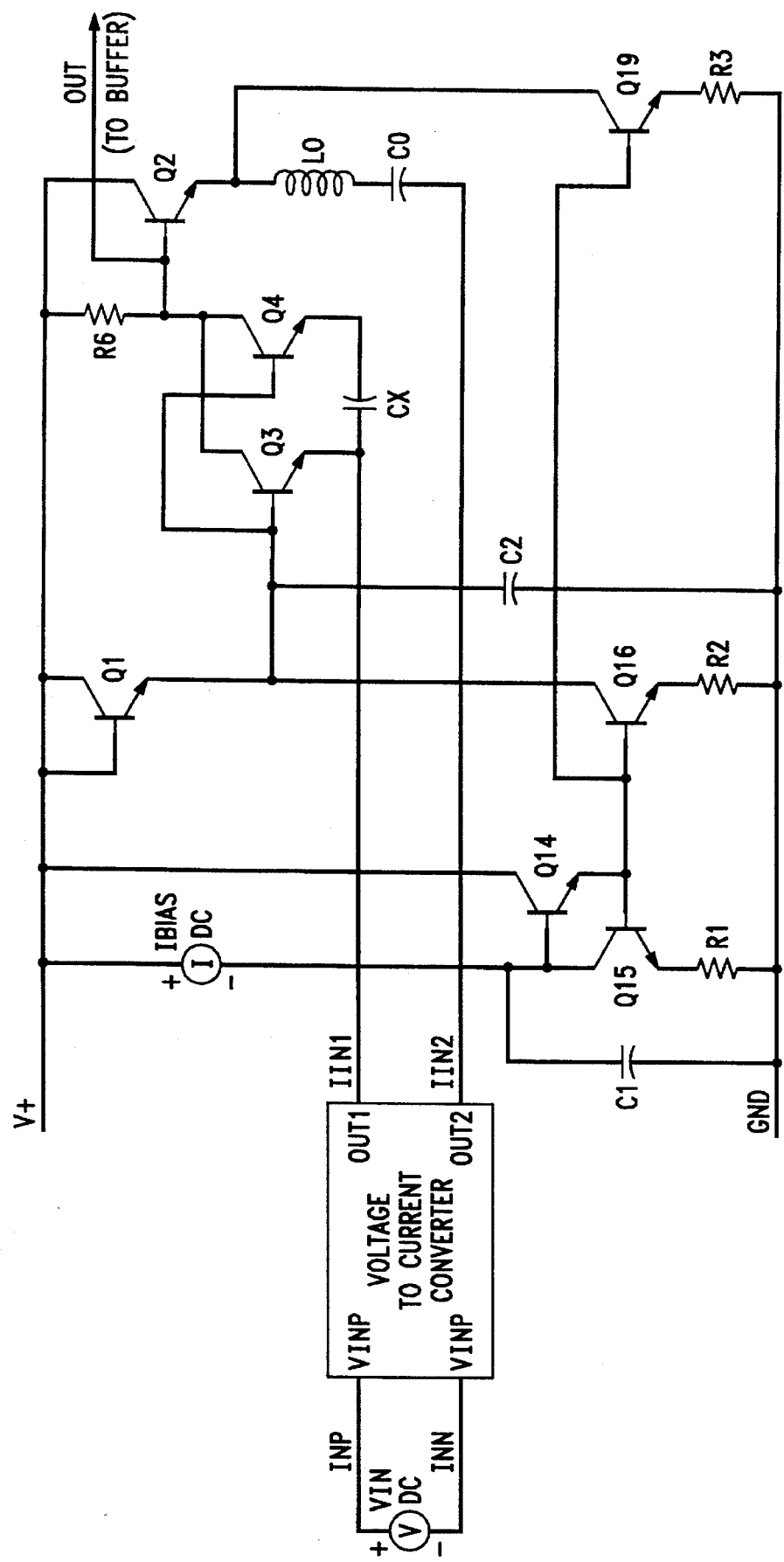
FIG. 1 depicts the circuit which shifts a variable fraction of the current passing through a series resonant circuit through a further capacitor in accordance with a control voltage applied to the circuitry of FIG. 2.

In FIG. 1, the emitter of transistor Q1 is in series with transistor Q16 and establishes a (dc) reference voltage at the base of transistors Q3 and Q4. Transistors Q1, Q14, Q15, Q16 and Q19 are high impedance bias current sources and do not enter into the operation of the oscillator at the frequency of oscillation. Leads IIN1 and IIN2 are current source leads from the power supply, FIG. 2.

Referring now to the right-hand side of FIG. 1, a series-resonant, negative-resistance loop for ac current is seen to be comprised of the the emitter circuit of emitter-follower transistor Q2, the series resonant combination of inductor L0 and capacitor C0, the emitter-collector paths of grounded-base transistors Q3 and/or Q4 and resistor R6. While an inductor-capacitor combination is shown connected to the emitter of transistor Q4, it should be apparent that a crystal, ceramic, or SAW resonator may be employed instead. Transistor Q2 is connected as an emitter-follower stage to provide a low impedance drive for the resonant circuit comprising inductor L0 and capacitor C0.

Responsive to random noise, transistor Q4 develops an output voltage across load resistor R6 in its collector circuit to provide the driving voltage for the base of transistor Q2. In order to provide sufficient voltage gain for oscillation, R6 must be larger than the total resistance in series with the resonant circuit. Leads IIN1 and IIN2 are the output leads of the high impedance, current source power supply of FIG. 2. Depending on the relative conduction of transistors Q3 and Q4, the ac emitter current of transistor Q2 passing through the series resonant circuit of L0 and C0 is shared between the emitter-collector paths of transistors Q3 and Q4, thereby effectively causing more or less ac current to flow through capacitor CX. When transistor Q4 is off, substantially all of the emitter current of transistor Q2 flows through capacitor CX and the emitter-collector path of transistor Q3 and develops a feedback voltage across R6. When transistor Q3 is off and transistor Q4 is on, substantially all of the emitter current of transistor Q2 bypasses capacitor CX and flows only through the emitter-collector path of transistor Q4 to develop the feedback voltage across R6. Accordingly, capacitor CX is or is not effectively inserted in series with capacitor C0 of the resonant circuit thereby affecting the capacitive reactance of the series resonant circuit. When transistor Q4 is on and tranistor Q3 is off, substantially all of the (ac) emitter current of transistor Q2 flows through lead IIN2. Capacitor CX is thereby effectively removed from the series resonant circuit causing its capacitive reactance to be at the value determined by C0 alone. When both transistors Q4 and Q3 are on, the ratio of the collector currents between leads IIN1 and IIN2 determines the relative amount of capacitor CX's capacitance that is effectively in series with capacitor C0, thereby determining the amount of capacitive reactance of the series resonant circuit and its frequency of oscillation.

The steering of oscillating current through capacitor CX is thus governed by the conducting states of transistors Q3 and Q4.

Figure 2:
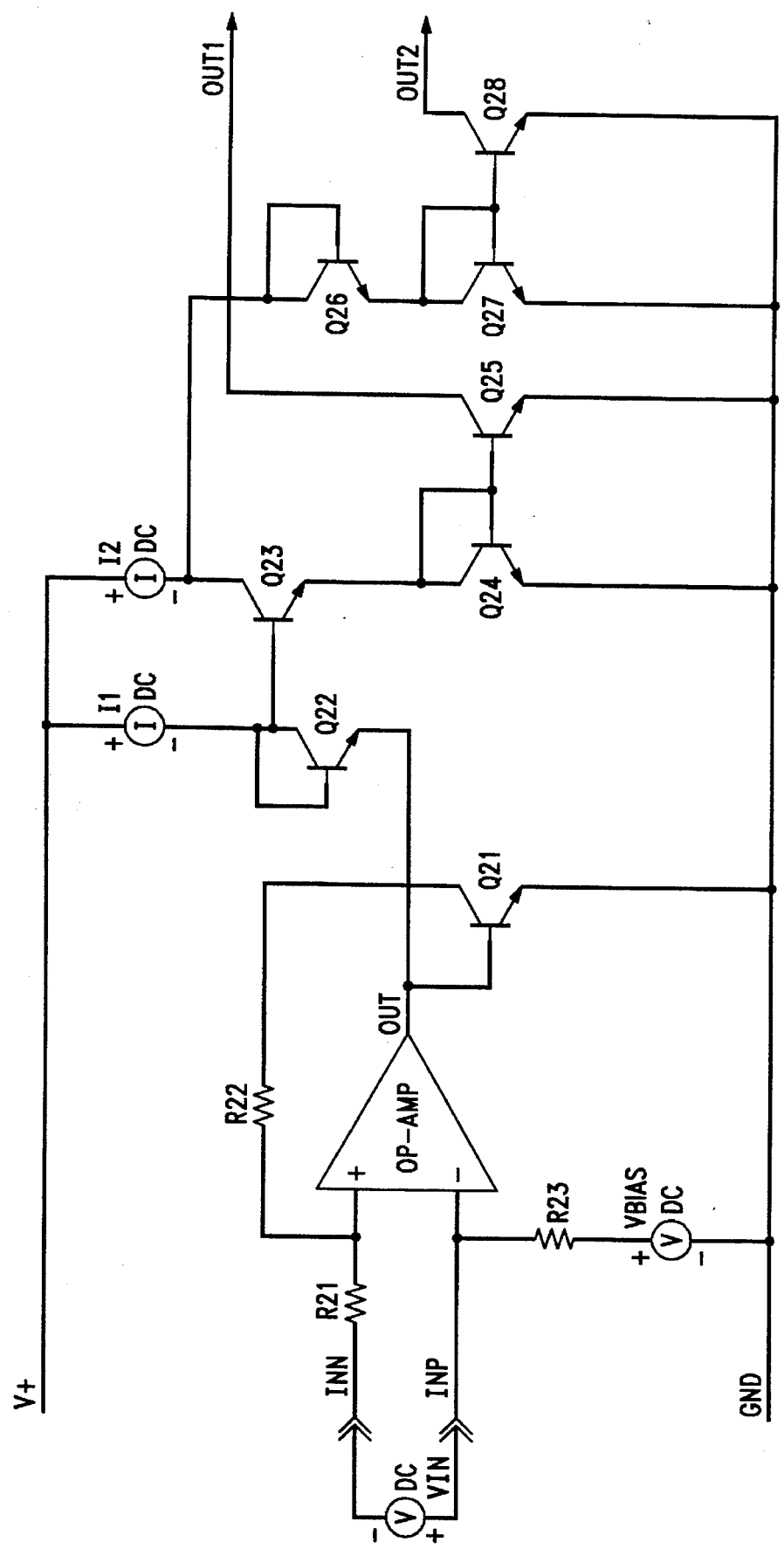
FIG. 2 shows the details of the circuitry which assures that the resonant frequency of the circuitry of FIG. 1 will vary linearly with the control voltage applied.

In accordance with the principles of my invention, I cause the frequency of the resonant circuit to vary more linearly with control voltage than has heretofore been possible by causing the sum of the two emitter currents to be constant as well as by causing the current of Q3 to vary as the square root of control voltage $V_{IN}$, FIG. 2.

Referring now to FIG. 2, current source I1 supplies current directly to the base of transistor Q23 and, through transistor Q22, to the base of transistor Q21. The base of transistor Q23 is two diode drops above ground. The base of transistor Q21 is connected to the output of the OPAMP. Q21 and the OPAMP form an operational amplifier combination. Since Q21 inverts the output of the OPAMP, the input INP of the OPAMP is the negative input and the input INN is the positive input. For a high-gain operational amplifier, the negative input becomes a virtual ground. Accordingly, the current flowing in R21 is $$\frac{(V_{IN} + V_{bias}) - V_{bias}}{R_{21}} = V_{IN}/R_{21} = I_{R21} = I_{R22} = I_{Q21} \quad (1)$$

and, more particularly, the emitter current $I_e$ through transistor Q21 is equal to $V_{IN}/R21$.

The OPAMP is employed to cause a current proportional to VIN to flow in Q21 and to sink the current flowing from the emitter of Q22. Note, that the OPAMP can both source and sink current.

In general, the emitter current flowing in an NPN transistor is given by $$I_e = I_o\, e^{\frac{-qV_{be}}{kT}} \quad (2)$$

where $I_o$ is the saturation current of transistor Q21. Conversely, the $V_{be}$ of transistor Q21 is proportional to the log of transistor Q21's emitter current.

Writing Kirkkhoff's voltage equation for the loop comprising the four identical NPN transistors Q21, Q22, Q23 and Q24 yields:

$$V_{be_{21}} + V_{b3_{22}} = V_{be_{23}} + V_{be_{24}} \quad (3)$$

where the subscript number on $V_{be}$ indicates the respective transistor.

where the subscript number on $V_{be}$ indicates the respective transistors. Each $V_{be}$ voltage drop is proportional to the ln of its respective Ie emitter current. Accordingly, equation (3) can be rewritten:

$$v_T \ln(VIN/RI_o) + v_T \ln(I_1/I_o) = v_T \ln(I_3/I_o) + v_T \ln(I_4/I_o) \quad (4)$$

where $I_o$ is the saturation current for the emitter-base junctions and $v_T$ is the thermal voltage KT/q.

It will be recalled that adding the logarithm of numbers is equivalent to multiplying the numbers. Equation (4) therefore represents a multiplication of the values represented by the base-emitter currents of transistors Q23 and Q24. Calling the current through Q23 and Q24 $I_A$, the current through Q25 is seen to be:

$$I_A = \sqrt{\frac{V_{IN} I_1}{R}} \quad (5)$$

and the current through Q26, Q27, Q28 is $I_2 - I_A$.

Accordingly, the sum of the currents on leads IIN1 and IIN2 of FIG. 1 is seen to be a constant equal to $I_2$.

What is claimed is:

1. A voltage-controlled oscillator comprising a series resonant circuit and a control circuit employing transistors, fixed capacitors and no varactors for varying the effective amount of capacitance present in said resonant circuit so that the resonant frequency varies substantially linearly with control voltage.

2. A voltage-controlled oscillator comprising a series resonant circuit and a control circuit in which said control circuit includes a two-transistor circuit for driving said resonant circuit and a current supply circuit for controlling the relative amount of current through the transistors of said two-transistor circuit as a control voltage is varied.

3. A voltage-controlled oscillator in accordance with claim 2 wherein said current supply circuit effects a current through one of said transistors that varies with the square root of said control voltage.

4. A voltage-controlled oscillator in accordance with claim 2 wherein said two-transistor circuit includes a capacitor and wherein a variable fraction of the capacitance of said capacitor is effectively switched into and out of series with the capacitance of said series resonant circuit in accordance with the variation in said control voltage.

5. A voltage-controlled oscillator in accordance with claim 2 wherein said current supply circuit maintains the sum of the currents through said transistors of said two-transistor steering circuit constant as said control voltage is varied.

6. A voltage-controlled oscillator circuit including a resonant circuit in the emitter path of an output transistor comprising a two-transistor feedback circuit coupled to said output transistor, means for controlling the current through said two-transistor circuit so that the sum of the two transistors' dc emitter currents is constant, and means for controlling the dc current through one of the two transistors' emitters to vary as the square root of a control voltage.

7. A voltage-controlled oscillator circuit in accordance with claim 6 further comprising means for steering the ac current in said emitter path of said output transistor between one or the other of said transistors of said two-transistor feedback circuit in accordance with said control voltage.

8. A voltage-controlled oscillator circuit in accordance with claim 6 wherein said transistors of said feedback circuit are common-base connected transistors.

9. A voltage-controlled oscillator in accordance with claim 6 wherein said output transistor is an emitter-follower connected transistor.

10. A voltage-controlled oscillator in accordance with claim 6 wherein the collector currents of said two-transistor feedback circuit establish a voltage drop to develop the ac feedback for said output transistor.

* * * * *